United States Patent
Nulman

(10) Patent No.: US 6,654,698 B2
(45) Date of Patent: Nov. 25, 2003

(54) SYSTEMS AND METHODS FOR CALIBRATING INTEGRATED INSPECTION TOOLS

(75) Inventor: Jaim Nulman, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/881,316

(22) Filed: Jun. 12, 2001

(65) Prior Publication Data

US 2002/0188414 A1 Dec. 12, 2002

(51) Int. Cl.[7] .............................................. G01D 18/00
(52) U.S. Cl. ........................................................ 702/85
(58) Field of Search ........................... 702/85, 118, 119, 702/121; 438/18; 382/145; 700/121, 179, 254

(56) References Cited

U.S. PATENT DOCUMENTS

| | | | |
|---|---|---|---|
| 5,144,363 A | 9/1992 | Wittekoek et al. | 355/53 |
| 5,453,830 A | 9/1995 | Greed, Jr. | 356/243.4 |
| 5,657,254 A | 8/1997 | Sierk et al. | 364/571.05 |
| 5,840,595 A * | 11/1998 | Kobayashi | 438/16 |
| 5,866,437 A | 2/1999 | Chen et al. | 438/14 |
| 6,013,920 A | 1/2000 | Gordon et al. | 250/559.36 |
| 6,154,714 A * | 11/2000 | Lepejian | 702/118 |
| 6,245,581 B1 | 6/2001 | Bonser et al. | 438/8 |
| 6,283,692 B1 * | 9/2001 | Perlov et al. | 414/222.01 |
| 6,466,895 B1 * | 10/2002 | Harvey et al. | 702/181 |
| 6,532,428 B1 * | 3/2003 | Toprac | 702/97 |
| 2002/0186368 A1 * | 12/2002 | Rosengaus et al. | 356/237.2 |

FOREIGN PATENT DOCUMENTS

| | | |
|---|---|---|
| EP | 0 624 775 A1 | 11/1994 |
| JP | 57-108970 | 7/1982 |
| JP | 5-74675 | 3/1993 |
| JP | 5-304064 | 11/1993 |
| JP | 9-186215 | 7/1997 |

OTHER PUBLICATIONS

Solid State Technology, Apr. 2001, Claasen–Vujcic, Tanja; Hasper, Albert; Abraham, Michael: Analysis of a 200/300mm vertical furnace with integrated metrology XP–001025036.

* cited by examiner

Primary Examiner—Michael Nghiem
(74) Attorney, Agent, or Firm—Dugan & Dugan LLP

(57) ABSTRACT

Systems, methods and computer program products are provided for calibrating integrated the inspection tools of one or more processing tools. In a first aspect, a system is provided that includes (1) a processing tool adapted to process substrates; (2) an integrated inspection tool coupled to the processing tool; and (3) a controller adapted to communicate with the integrated inspection tool. The controller includes computer program code adapted to receive a first result generated by inspecting a production substrate with a stand-alone inspection tool, and to receive a second result generated by inspecting the production substrate with the integrated inspection tool. The computer controller further includes computer program code adapted to calibrate the integrated inspection tool based on the first and second results. Numerous other systems are provided, as are methods and computer program products.

35 Claims, 5 Drawing Sheets

SYSTEMS AND METHODS FOR CALIBRATING INTEGRATED INSPECTION TOOLS

FIELD OF THE INVENTION

The present invention relates generally to calibrating inspection tools used during semiconductor device manufacturing and other similar processes. More specifically, the present invention relates to calibrating integrated inspection tools used during semiconductor device manufacturing and other similar processes.

BACKGROUND OF THE INVENTION

A recent advance in semiconductor device manufacturing has been the development of metrology and/or defect detection tools that are "coupled" to a processing tool and that allow a semiconductor substrate to be inspected while at the processing tool rather than requiring the substrate to be transferred to a stand-alone inspection tool. Inspection tools that are coupled in this manner to processing tools are referred to herein as "integrated inspection tools".

Exemplary integrated inspection tools include the Excite™ or integrated particle monitor (IPM™) defect detection tool manufactured by Applied Materials, Inc. Such integrated inspection tools may be, for example, coupled to a factory interface (e.g., a robot chamber that transfers substrates between a factory transport agent and a processing tool) as is known in the art.

While integrated inspection tools offer numerous advantages over stand-alone inspection tools (e.g., increased throughput via the elimination of lengthy substrate transfers from a processing tool to a stand-alone inspection tool), such tools still must be calibrated to ensure their accuracy. For example, a typical semiconductor device manufacturing facility may employ numerous processing tools each having one or more integrated inspection tools that must be periodically calibrated.

One technique for calibrating an integrated inspection tool is to (1) inspect what is known as a "standard" substrate having known properties (e.g., a substrate having one or more precisely defined parameters such as a uniformly deposited film having a thickness that is guaranteed to reside within a tightly defined tolerance) with the integrated inspection tool to generate a "result" (e.g., a measured film thickness); and (2) adjust the tool so that the result matches the known properties of the standard substrate. However, such an approach has drawbacks.

Standard substrates are expensive, and employing a unique standard substrate for every integrated inspection tool to be calibrated may be cost prohibitive. Likewise, sharing a few standard substrates among numerous processing tools may create significant processing delays if one or more processing tools must idle while waiting for a standard substrate being employed by another processing tool.

Accordingly, a need exists for improved systems and methods for calibrating integrated inspection tools.

SUMMARY OF THE INVENTION

In accordance with aspects of the present invention, novel systems, methods and computer program products are provided for calibrating the integrated inspection tools of one or more processing tools. In a first aspect of the invention, a system is provided that includes (1) a processing tool adapted to process substrates; (2) an integrated inspection tool coupled to the processing tool; and (3) a controller adapted to communicate with the integrated inspection tool. The controller includes computer program code adapted to receive a first result generated by inspecting a production substrate with a stand-alone inspection tool, and to receive a second result generated by inspecting the production substrate with the integrated inspection tool. The controller further includes computer program code adapted to calibrate the integrated inspection tool based on the first and second results.

In accordance with a second aspect of the invention, a system is provided that includes (1) a processing tool adapted to process substrates; (2) an integrated inspection tool coupled to the processing tool; and (3) a controller adapted to communicate with the integrated inspection tool. The controller includes computer program code adapted to receive a first result generated by inspecting a production substrate with a stand-alone inspection tool, and to initiate a transfer of the production substrate from the stand-alone inspection tool to a storage location near the processing tool. The controller further includes computer program code adapted to initiate a transfer of the production substrate from the storage location to the integrated inspection tool, and to receive a second result generated by inspecting the production substrate with the integrated inspection tool. The controller also includes computer program code adapted to calibrate the integrated inspection tool based on the first and second results.

Methods and computer program products are provided in accordance with these and other embodiments of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAIL DESCRIPTION

Relevant Terminology

As used herein, an integrated inspection tool refers to an inspection tool that is coupled to a processing tool. The inspection tool may be coupled to the processing tool directly (e.g., to a transfer or buffer chamber of the processing tool) or indirectly (e.g., via an interface such as a factory interface). A processing tool may include any known semiconductor device processing tool such as an etch tool, a deposition tool, a cleaning tool, an oxidation tool, a planarization tool or the like, or any other similar processing tool (e.g., a processing tool used for fabricating flat panel displays).

A stand-alone inspection tool refers to an inspection tool that is not coupled to a processing tool. An inspection tool refers to a tool capable of performing defect detection or metrology. Defect detection refers to the detection and/or identification of defects, contaminants, flaws, imperfections, deficiencies or the like. Metrology refers to the determination of one or more material parameters such as thickness, composition, index of refraction, atomic structure, mechanical properties, electrical properties or the like.

Determining may include selecting, calculating, computing, defining, delineating, measuring or the like. Directing may include applying, initiating, controlling, managing or the like. Configured to or adapted to may include formed to, designed to, selected to, constructed to, manufactured to, programmed to or the like. Communication may include one or two way communication, polling, or the like.

Exemplary Embodiments of the Invention System

Figure 1A:
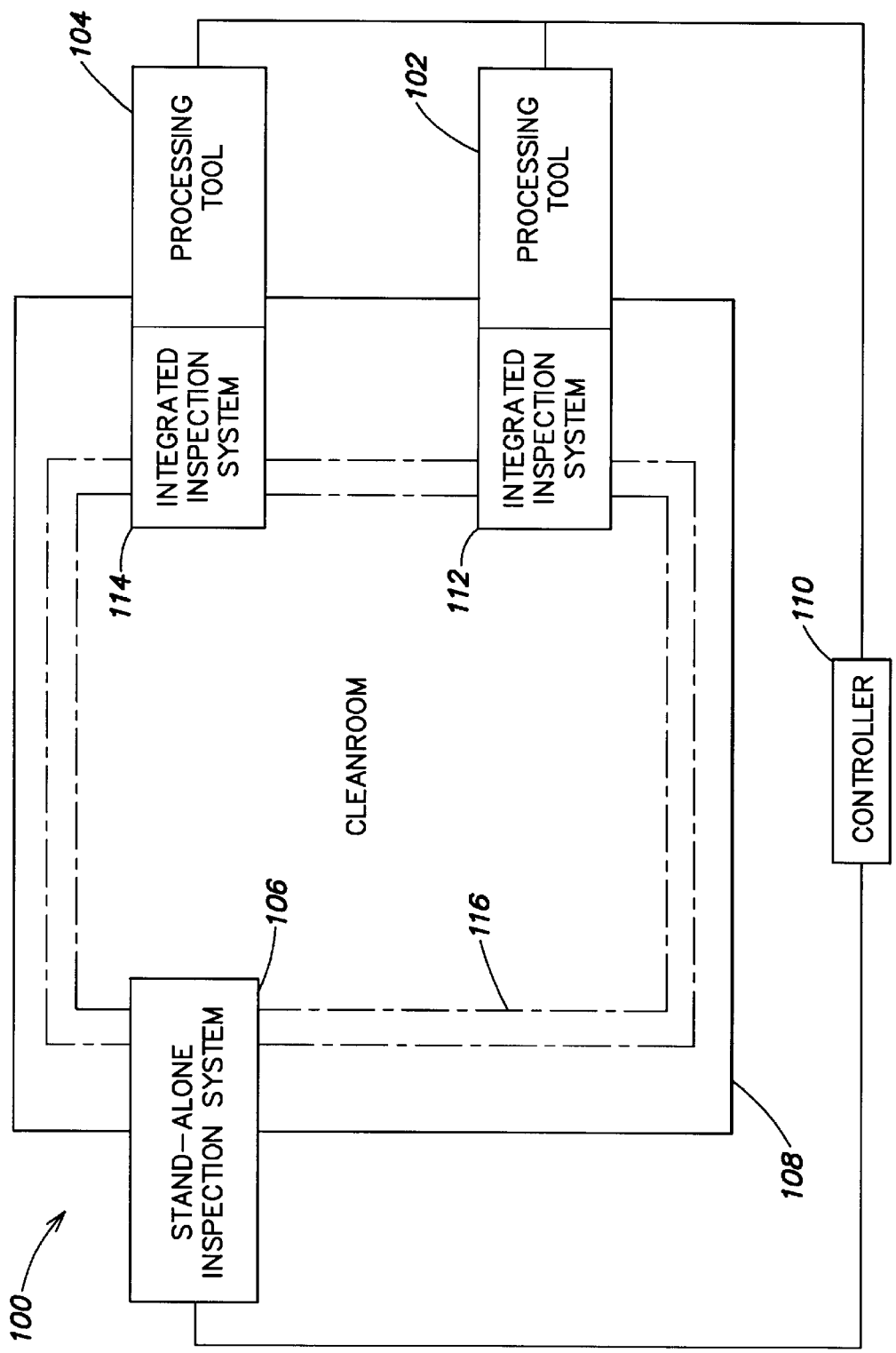
FIG. 1A is a schematic diagram of an inventive system for calibrating the integrated inspection tools of one or more processing tools in accordance with the present invention.

FIG. 1A is a schematic diagram of an inventive system 100 for calibrating the integrated inspection tools of one or more processing tools in accordance with the present invention. With reference to FIG. 1A, the inventive system 100 includes a first processing tool 102, a second processing tool 104 and a stand-alone inspection tool 106 (e.g., each located at least partially within a clean room 108). Each tool 102, 104 is in communication with a controller 110, as is the stand-alone inspection tool 106. More than one controller and/or stand-alone inspection tool also may be employed, as may additional or fewer processing tools.

In the exemplary embodiment of FIG. 1A, the first processing tool 102 includes an integrated inspection tool 112 and the second processing tool 104 includes an integrated inspection tool 114. Each integrated inspection tool 112, 114 is adapted to inspect substrates processed within the processing tool 102, 104 (e.g., before and/or after the substrates are delivered to the processing tool 102, 104).

The processing tools 102, 104 and the stand-alone inspection tool 106 may each include an interface (not shown) such as a factory interface for receiving substrates and delivering the substrates to the tools 102, 104 and to the stand-alone inspection tool 106. For example, each interface (not shown) may be coupled to an overhead conveyor system (e.g., a factory wide conveyor system, a clean room wide conveyor system 116, etc.) to receive substrates, or may receive substrates via any other mechanism (e.g., via an automated guided vehicle, a technician, or the like). In this manner, substrates may be transferred between the processing tools 102, 104 and the stand-alone inspection tool 106 as described below.

The first processing tool 102 may comprise any apparatus suitable for performing semiconductor device manufacturing processes or similar processes such as an etch tool, a deposition tool, a lithography tool, a planarization tool, an electroplating tool, etc. One exemplary embodiment of the first processing tool 102 is described below with reference to FIG. 3.

Figure 3:
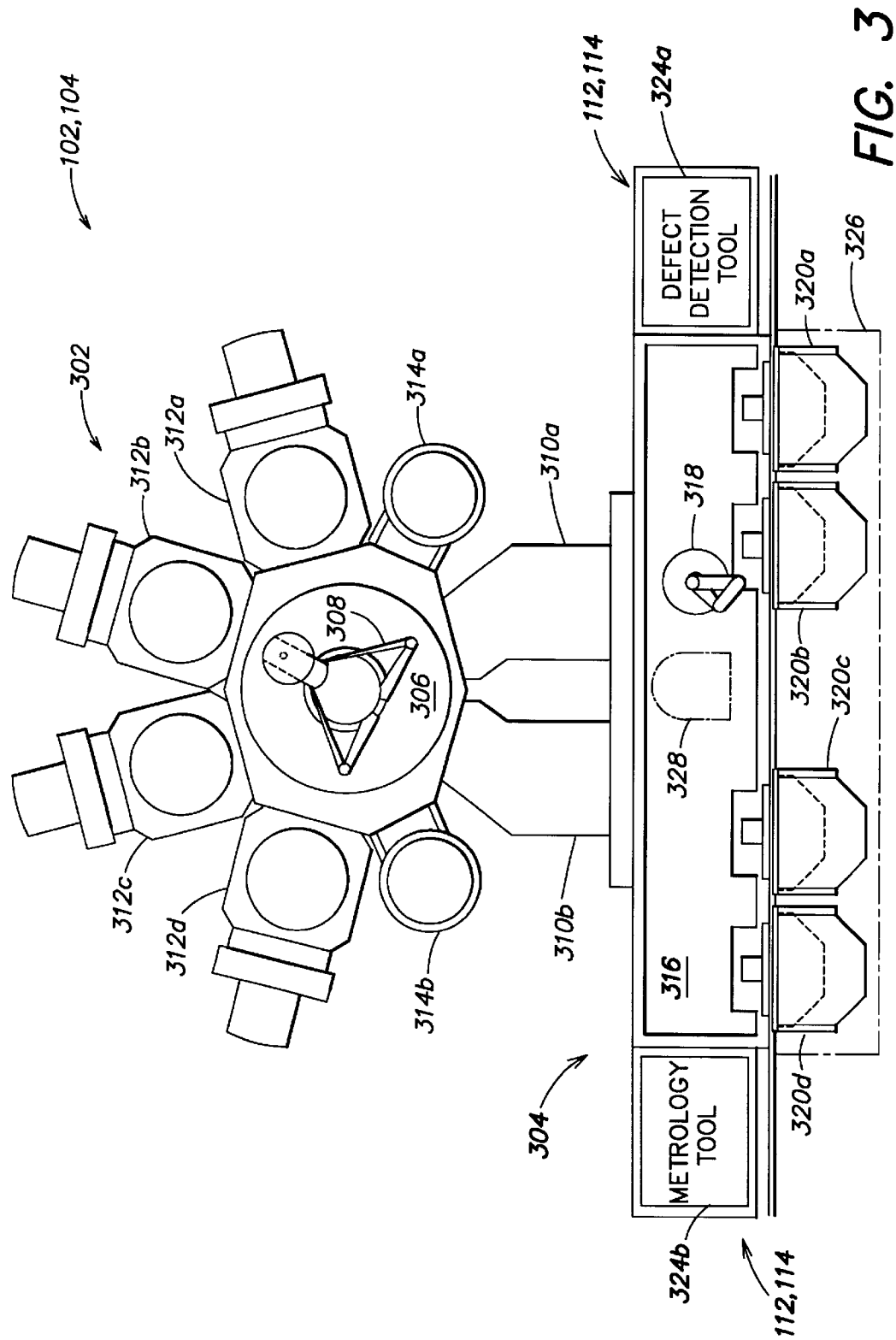
FIG. 3 is a top plan view of an exemplary embodiment of the first processing tool and/or the second processing tool of FIG. 1A.

The second processing tool 104 similarly may comprise any apparatus suitable for performing semiconductor device manufacturing processes or similar processes such as an etch tool, a deposition tool, a lithography tool, a planarization tool, an electroplating tool, etc. The second processing tool 104 also may be configured as shown in FIG. 3.

The stand-alone inspection tool 106 may comprise any conventional stand-alone inspection tool such as a conventional stand-alone thickness measurement tool, defect detection tool or the like. Manufacturers of conventional stand-alone inspection tools include, for example, KLA-encor and Applied Materials, Inc. One exemplary stand-alone inspection tool is the stand-alone version of the Excite™ defect detection tool manufactured by Applied Materials, Inc. The clean room 108 may comprise any conventional clean room, and the processing tools 102, 104 and the stand-alone inspection tool 106 need not be located in the same clean room. An exemplary embodiment of the controller 110 is described below with reference to FIG. 2. Exemplary integrated inspection tools are described below with reference to FIG. 3.

As described below with reference to FIGS. 1B–3, the inventive system 100 allows any number of integrated inspection tools to be easily and rapidly calibrated without requiring the integrated inspection tools to inspect costly "standard" substrates. Each integrated inspection tool may be calibrated by inspecting a "production" substrate (i.e., a substrate that need not (but may) be a standard substrate) with a stand-alone inspection tool, inspecting the production substrate with an integrated inspection tool, determining the difference in the results of the inspections and using the difference as an offset for the integrated inspection tool's future measurements. Performing this process for each integrated inspection tool may quickly and inexpensively eliminate tool-to-tool measurement variations.

Aspects of the invention allow a plurality of production substrates to be inspected by the stand-alone inspection tool 106 and distributed to and stored near the processing tools 102 and 104. Each integrated inspection tool 112, 114 then may be calibrated at any time based on the production substrates stored near the processing tools 102, 104 without requiring long transfer delays between the stand-alone inspection tool 106 and the integrated inspection tool 112, 114, and without waiting for the stand-alone inspection tool 106 to perform inspections. Integrated inspection tool calibration times thereby are significantly decreased. Numerous other aspects are also provided.

Specific exemplary processes that may be performed by the inventive system 100 are described with reference to FIGS. 1B and 1C. Exemplary embodiments of the controller 110 are described with reference to FIG. 2, and exemplary embodiments of the processing tools 102, 104 are described below with reference to FIG. 3.

Figure 1B:
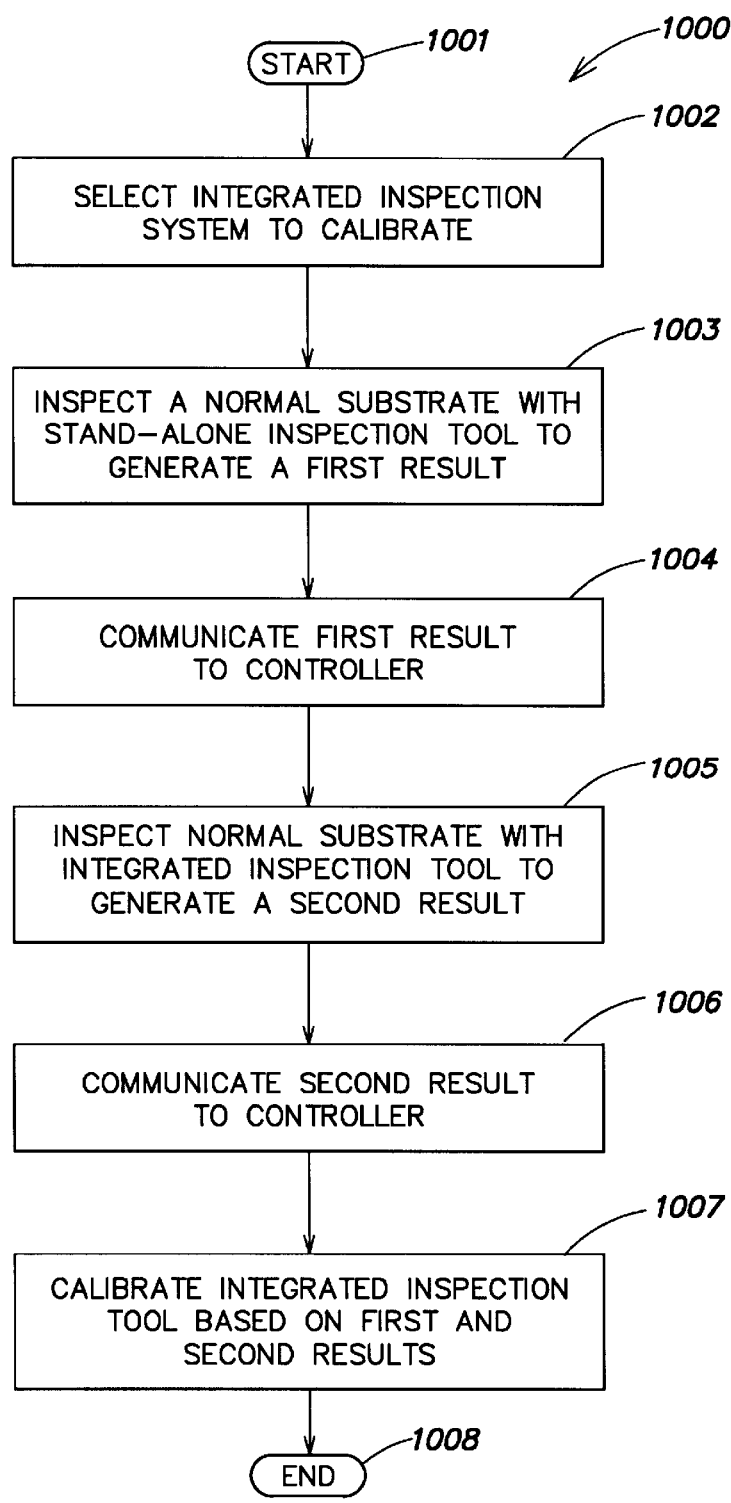
FIG. 1B is a flowchart of a first exemplary process that may be performed by the system of FIG. 1A.

FIG. 1B is a flowchart of a first exemplary process 1000 that may be performed by the system 100 of FIG. 1A. One or more of the steps of the process 1000 may be embodied in computer program code executable by the controller 110 and/or embodied as one or more computer program products.

With reference to FIG. 1B, the process 1000 begins in step 1001. In step 1002, the controller 110 selects one of the integrated inspection tools 112, 114 of the processing tools 102, 104 to calibrate. For example, the controller 110 may contain an algorithm (e.g., computer program code) that determines when each integrated inspection tool 112, 114 is to be calibrated. The controller 110 may choose to calibrate an integrated inspection tool after a certain number of substrates have been processed within the processing tool coupled to the integrated inspection tool, after a certain number of substrates have been inspected by the integrated inspection tool, after a certain time period (e.g., every 2 hours, daily, weekly, monthly, etc.) or based on any other criterion.

After one of the integrated inspection tools 112, 114 has been selected for calibration, in step 1003 the controller 110 directs the stand-alone inspection tool 106 to inspect a production substrate, thereby generating a first result (e.g., a thickness measurement, a defect density measurement, an etch dimension measurement, etc.).

Production substrates may be stored near the stand-alone inspection tool 106, near the processing tools 102, 104 or at any other location. In at least one embodiment described below with reference to FIG. 1C, production substrates are stored near the processing tools 102, 104 after the substrates have been inspected with the stand-alone inspection tool 106. However, production substrates similarly may be stored near the processing tools 102, 104 prior to inspection with the stand-alone inspection tool 106, and transferred to the stand-alone inspection tool 106 during calibration (e.g., via a conveyor system, a technician, etc.).

In step 1004, the stand-alone inspection tool 106 communicates the first result to the controller 110.

Assuming the first integrated inspection tool 112 was selected in step 1002, in step 1005, the production substrate inspected by the stand-alone inspection tool 106 is transferred to the integrated inspection tool 112 and is inspected. During and/or after inspecting the production substrate in step 1005, the integrated inspection tool 112 generates a second result (e.g., a thickness measurement, a defect density measurement, an etch dimension measurement, etc.). In step 1006, the integrated inspection tool 112 communicates the second result to the controller 110.

In step 1007, the controller 110 calibrates the integrated inspection tool 112 based on the first and second results. For example, the controller 110 may calibrate the integrated inspection tool 112, by (1) determining any difference between the first result (the result generated by the stand-alone inspection tool 106) and the second result (the result generated by the integrated inspection tool 112); and (2) offsetting each future result generated by the integrated inspection tool 112 by this difference. Any other calibration technique may be similarly employed including adjusting weighting factors, system constants, formulas or the like used by the integrated inspection tool 112 to generate inspection results. In step 1008, the process 1000 ends.

The process 1000 may be employed to calibrate the integrated inspection tool of each processing tool 102, 104, and the controller 110 may include computer program code for scheduling the calibration of each integrated inspection tool (e.g., so as to minimize delays due to production substrate transfer operations between the stand-alone inspection tool 106 and the processing tools 102, 104). During calibration a production substrate may be inspected by an integrated inspection tool before being inspected by the stand-alone inspection tool 106; and results of inspections may be communicated to the controller 110 at any time.

Figure 1C:
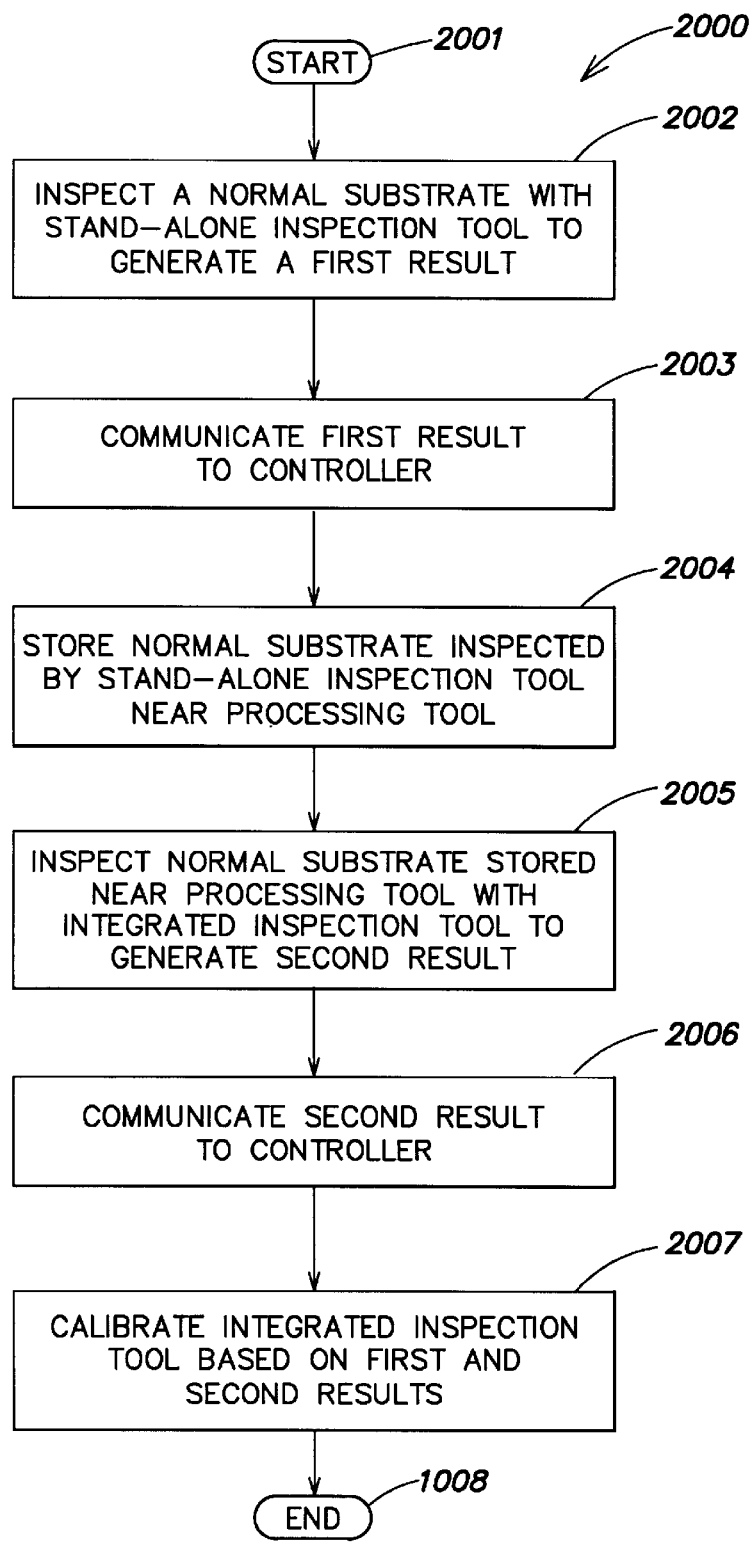
FIG. 1C is a flowchart of a second exemplary process that may be performed by the system of FIG. 1A.

FIG. 1C is a flowchart of a second exemplary process 2000 that may be performed by the system 100 of FIG. 1A. One or more of the steps of the process 2000 may be embodied in computer program code executable by the controller 110 and/or embodied as one or more computer program products.

With reference to FIG. 1C, the process 2000 begins in step 2001. In step 2002, the stand-alone inspection tool 106 is employed to inspect a production substrate, thereby generating a first result.

In step 2003, the stand-alone inspection tool 106 communicates the first result to the controller 110. In step 2004, the production substrate inspected by the stand-alone inspection tool 106 is transferred to and is stored near one of the processing tools 102, 104. For example, assuming the production substrate is to be employed to calibrate the integrated inspection tool 112 of the processing tool 102, the production substrate may be stored near the processing tool 102 (e.g., such as in a local storage location of a factory interface of the processing tool 102 as described below with reference to FIG. 3). Similarly, if the production substrate inspected by the stand-alone inspection tool 106 is to be employed to calibrate the integrated inspection tool 114 of the processing tool 104, the production substrate may be stored near the processing tool 104.

Assuming the integrated inspection tool 112 is to be calibrated, in step 2005, the integrated inspection tool 112 is directed to inspect the production substrate stored near the processing tool 102, thereby generating a second result. In step 2006, the second result is communicated to the controller 110.

In step 2007, the controller 110 calibrates the integrated inspection tool 112 based on the first and second results. In step 2008, the process 2000 ends.

The integrated inspection tool 114 may be similarly calibrated. Additionally, the stand-alone inspection tool 106 may inspect a plurality of production substrates (to be used to calibrate both the integrated inspection tools 112, 114) and may store one or more of the inspected production substrates near each processing tool 102, 104. Each integrated inspection tool 112, 114 then may be calibrated at any time without requiring additional inspections by the stand-alone inspection tool 106 (e.g., by employing the production substrate or substrates that were inspected by the stand-alone inspection tool 106 and stored near the integrated inspection tool).

For example, because each processing tool 102, 104 may perform numerous processes (e.g., a plurality of deposition processes that produce deposited films of different thicknesses, a plurality of etch processes that produce etch features of different depths, widths or profiles, a combination of deposition and etch processes, etc.), it may be desirable to calibrate each integrated inspection tool 112, 114 for each process performed (e.g., so that the integrated inspection tools may perform more accurate inspections on different thickness films or on different types of films, on different etch features, etc.). Thus, a plurality of production substrates may be employed to calibrate each integrated inspection tool 112, 114 wherein each production substrate is specifically configured to allow the integrated inspection tool 112, 114 to be calibrated for a different process performed within the processing tool 102, 104.

It will be understood that the integrated inspection tools 112, 114 may be inspected simultaneously or at different times. The controller 110 may comprise computer program code for scheduling the calibration of each integrated inspection tool 112, 114. The controller 110 may choose to calibrate an integrated inspection tool after a certain number of substrates have been processed within the processing tool coupled to the integrated inspection tool, after a certain number of substrates have been inspected by the integrated inspection tool, after a certain time period (e.g., every 2 hours, daily, weekly, monthly, etc.) or based on any other criterion. The controller 110 also may include computer program code for scheduling when and/or if the stand-alone inspection tool 106, the integrated inspection tool 112 and/or the integrated inspection tool 114 are calibrated using a standard substrate (e.g., using conventional calibration techniques).

Figure 2:
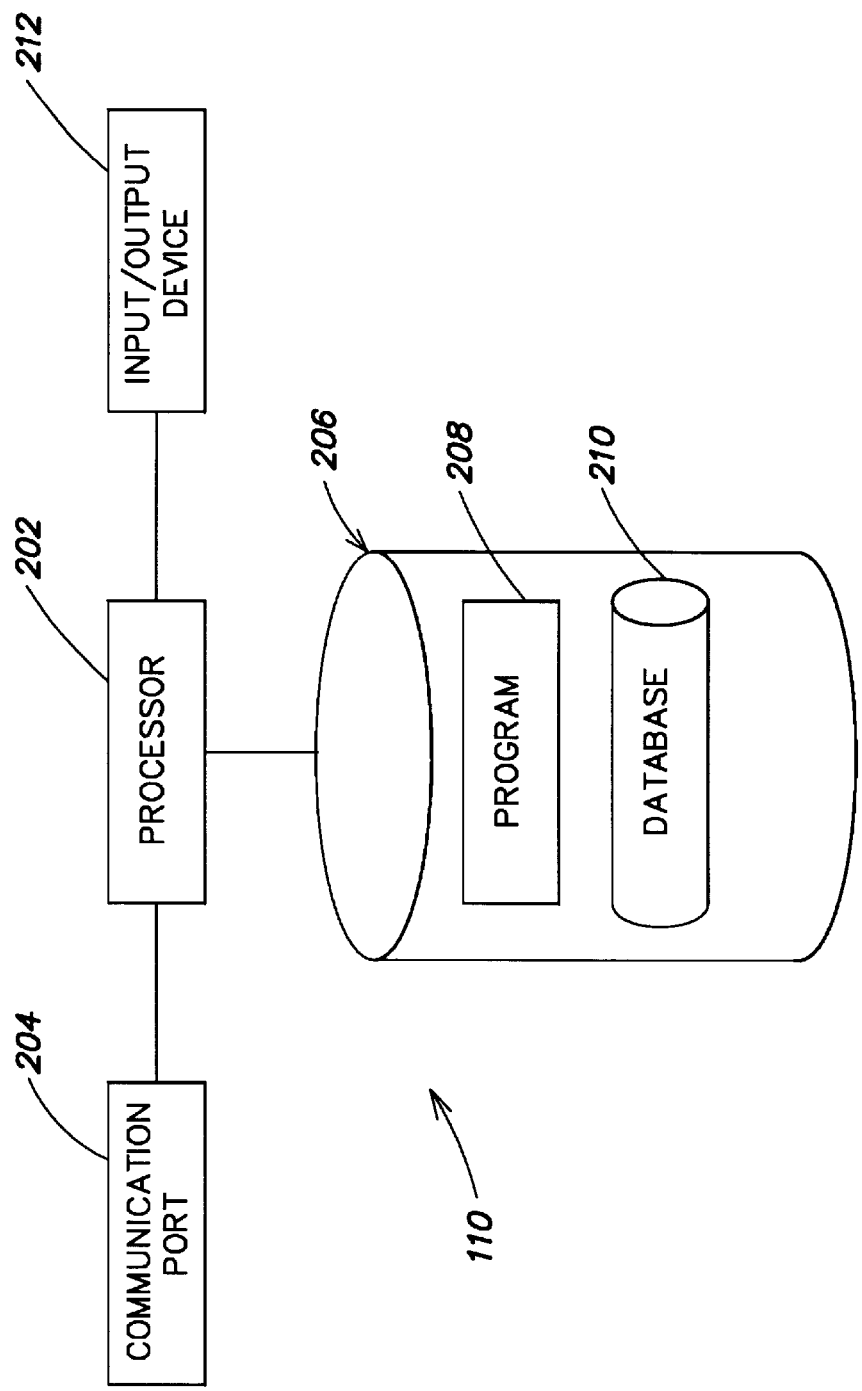
FIG. 2 is a schematic diagram of an exemplary embodiment of the controller of FIG. 1A.

FIG. 2 is a schematic diagram of an exemplary embodiment of the controller 110 of FIG. 1A. The controller 110 may be implemented as a system controller, as a dedicated hardware circuit, as an appropriately programmed general purpose computer, or as any other equivalent electronic, mechanical or electromechanical device.

With reference to FIG. 2, the controller 110 comprises a processor 202, such as one or more conventional microprocessors (e.g., one or more Intel® Pentium® processors). The processor 202 is in communication with a communication port 204 through which the processor 202 communicates with other devices (e.g., with tools 102, 104, with the stand-alone inspection tool 106 and/or with any other relevant device). The communication port 204 may include multiple communication channels for simultaneous communication with, for example, the first processing tool 102, the second processing tool 104, the stand-alone inspection tool 106 and/or any other relevant device.

Those skilled in the art will understand that devices in communication with each other need only be "capable of" communicating with each other and need not be continually transmitting data to or receiving data from each other. On the contrary, such devices need only transmit data to or receive data from each other as necessary, and may actually refrain from exchanging data most the time. Further, devices may be in communication even though steps may be required to establish a communication link.

The processor 202 also is in communication with a data storage device 206. The data storage device 206 may comprise an appropriate combination of magnetic, optical and/or semiconductor memory, and may include, for example, random access memory (RAM), read only memory (ROM), a compact disk, a floppy disk, a DVD, a hard disk, or any other storage medium. The processor 202 and the data storage device 206 each may be, for example, located entirely within a single computer or other computing device, or connected to each other by a communication medium, such as a serial port cable, a telephone line or a radio frequency transceiver. Alternatively, the controller 110 may comprise one or more computers that are connected to a remote server computer (not shown).

In the exemplary embodiment of the controller 110 shown in FIG. 2, the data storage device 206 may store, for example, (i) a program 208 (e.g., computer program code and/or a computer program product) adapted to direct the processor 202 in accordance with the present invention, and particularly in accordance with one or more of the processes described in detail herein; and (ii) a database 210 adapted to store various information employed by the controller 110 such as system constants for one or more of the tools 102, 104 (e.g., calibration constants), algorithms for determining when to calibrate the integrated inspection tool of each processing tool 102, 104 as previously described, and/or any other relevant information. Note that rather than employing a database 210 to store system constants, algorithms or the like, such information may be hard coded in the program 208.

The program 208 may be stored in a compressed, an uncompiled and/or an encrypted format, and may include computer program code that allows the controller 110 to:
1. receive a first result generated by inspecting a production substrate with the stand-alone inspection tool 106;
2. receive a second result generated by inspecting the production substrate with the integrated inspection tool 112 or 114; and
3. calibrate the integrated inspection tool 112 or 114 based on the first and second results.

Numerous additional functions and/or processes may be performed via the controller 110 as described further below.

The computer program code required to implement the above functions (and the other functions described herein) can be developed by a person of ordinary skill in the art, and is not described in detail herein. The controller 110 may include any peripheral devices (e.g., keyboards, computer displays, pointing devices, etc., represented generally as input/output device 212) required to implement the above functionality.

Note that instructions of the program 208 may be read into a main memory (not shown) of the processor 202 from a computer readable medium other than the data storage device 206 such as from a ROM or from a RAM. While execution of sequences of instructions in the program 208 causes the processor 202 to perform many of the process steps described herein, hardwired circuitry may be used in place of, or in combination with, software instructions for implementation of the processes of the present invention. Thus, embodiments of the present invention are not limited to any specific combination of hardware and software.

FIG. 3 is a top plan view of an exemplary embodiment of the first processing tool 102 and/or the second processing tool 104 of FIG. 1A (as represented by reference numerals 102, 104 in FIG. 3). With reference to FIG. 3, the processing tool 102, 104 comprises a processing system 302 coupled to a factory interface 304. The processing system 302 includes a transfer chamber 306 which houses a first substrate handler 308. The transfer chamber 306 is coupled to a first loadlock 310a, a second loadlock 310b, a first processing chamber 312a, a second processing chamber 312b, a third processing chamber 312c, a fourth processing chamber 312d, a first auxiliary processing chamber 314a and a second auxiliary processing chamber 314b. Fewer or more processing chambers or auxiliary processing chambers may be employed, and the controller 110 may communicate with and/or control the processes performed within each chamber.

Loadlock chambers 310a–b may comprise any conventional loadlock chambers capable of transferring substrates from the factory interface 304 to the transfer chamber 306. The processing chambers 312a–d may comprise any conventional processing chambers such as etch chambers, deposition chambers, etc. The auxiliary processing chambers 314a–b, if employed, may include, for example, cooldown chambers, substrate orientors, degas chambers, inspections chambers or the like. In the embodiment of FIG. 3, the processing system 302 is based on a Centura™ platform manufactured by Applied Materials, Inc. Any other platform/system may be similarly employed such as an Endura™ platform or a Producer™ platform, a Mirra™ Mesa™ cleaning system, a Mirra™ Reflexion™ cleaning system, etc., all manufactured by Applied Materials, Inc. That is, the processing system 302 may perform any semiconductor device manufacturing process (or similar process) and may be based on any equipment platform.

The factory interface 304 includes a buffer chamber 316 which houses a second substrate handler 318 and which is coupled to a plurality of loadports 320a–d. It will be understood that in general, any number of substrate handlers may be located within the buffer chamber 316, and that any number of loadports may be coupled to the buffer chamber 316. Local carrier storage 326 (shown in phantom) for supplying substrate carriers such as front opening unified pods (FOUPs) to the interface 304 may be coupled to the interface 304. Exemplary local carrier storage 326 includes a stocker such as a central stocker, a bay stocker or the like. In one embodiment, the local carrier storage 326 comprises a bay distributed stocker adapted to store FOUPs on storage shelves located above the factory interface 304 as described in U.S. patent application Ser. No. 09/201,737, filed Dec. 1, 1998 and titled "Apparatus for Storing and Moving a Cassette", the entire contents of which are hereby incorporated by reference herein. Additional local storage may be provided within the factory interface 304 such as at a storage location 328 (shown in phantom) that is adapted to store individual substrates within the buffer chamber 316.

In at least one embodiment of the invention, production substrates inspected by the stand-alone inspection tool 106 may be stored near a processing tool (e.g., in step 2004 of FIG. 1C) by storing the substrates in the local carrier storage 326. The substrates may be stored in a substrate carrier such as a FOUP, etc. For example, production substrates may be stored in a FOUP on a shelf of a stocker (e.g., a bay distributed stocker). Production substrates also may be stored in the storage location 328 of the factory interface 304.

As shown in FIG. 3, the processing tool 102, 104 includes the integrated inspection tool 112 or 114 (as indicated by reference numerals 112, 114 in FIG. 3). In the exemplary embodiment of FIG. 3, the integrated inspection tool 112, 114 includes a defect detection tool 324a and a metrology tool 324b both coupled to the buffer chamber 316 of the factory interface 304. Alternatively, the integrated inspection tool 112, 114 may include only one of the defect detection tool 324a and the metrology tool 324b, or may be coupled directly to the processing tool 302 rather than to the factory interface 304 (e.g., by coupling the defect detection tool 324a and/or the metrology tool 324b to the transfer chamber 306 such as at the location of one or more of the auxiliary processing chambers 314a–b).

The defect detection tool 324a may comprise any conventional defect detection tool capable of detecting and/or characterizing defects on a surface of a substrate. In at least one embodiment of the invention, the defect detection tool 324a comprises the Excite™ defect detection tool manufactured by Applied Materials, Inc. The defect detection tool 324a may, for example, merely provide a measure of defect density on a substrate surface or may provide detailed information about any detected defects such as defect characterization information. The defect detection tool 324a may provide such information to the controller 110.

The metrology tool 324b may comprise any conventional integrated metrology tool such as a thickness measurement tool, an etch depth/width/profile measurement tool or the like. The metrology tool 324b may provide measurement information to the controller 110.

In operation, a substrate carrier is delivered to the factory interface 304 of the processing tool 102, 104 of FIG. 3 (e.g., from local carrier storage 326, from an overhead conveyor system, etc.). In particular, the substrate carrier is delivered to one of the loadports 320a–d. Each loadport 320a–d may or may not be configured with pod opening capability for opening sealed substrate carriers. Once the substrate carrier has been loaded into the appropriate loadport 320a–d of the factory interface 304, the substrate handler 318 retrieves a substrate from the substrate carrier and transfers the substrate to the first loadlock 310a. Thereafter the substrate handler 308 of the processing tool 302 retrieves the substrate from the first loadlock 310a and transfers the substrate to one of the chambers 312a–d. The substrate is then processed within the chamber, and transferred to and processed within the remaining chambers if desired. Thereafter, the substrate is transferred to the second loadlock 310b.

Prior to processing within one of the chambers 312a–d and/or after processing within one of the chambers 312a–d the substrate may be processed within one or both of the auxiliary processing chambers 314a–b (e.g., for substrate orientation purposes, for degassing, for cooldown, etc.).

The substrate handler 318 of the factory interface 304 retrieves the substrate from the second loadlock 310b and transfers the substrate to one of the defect detection tool 324a and the metrology tool 324b. Assuming the substrate is first transferred to the defect detection tool 324a, the defect detection tool 324a performs defect detection (e.g., determines the defect density on the surface of the substrate, identifies or otherwise characterizes defects on the surface of the substrate, etc.) and communicates information regarding the results of the defect detection to the controller 110. The substrate handler 318 of the factory interface 304 retrieves the substrate from the defect detection tool 324a and transfers the substrate to the metrology tool 324b.

The metrology tool 324b analyzes the substrate to determine information applicable to the process performed on the substrate within the processing system 302 (e.g., measures etch depth, etch width, etch profile, deposited film thickness, etc.). The metrology tool 324b then provides this information to the controller 110. The substrate handler 318 of the factory interface 304 retrieves the substrate from the metrology tool 324b and returns the substrate to a substrate carrier (located within one of the loadports 320a–d and/or in the local carrier storage 326). The substrate handler 318 may be similarly employed to transfer production substrates between the loadports 320a–d and the tools 324a, 324b (during calibration operations).

The defect detection tool 324a and the metrology tool 324b may be calibrated employing the inventive processes described herein (e.g., process 1000 or 2000). For example, production substrates inspected via the stand-alone inspection tool 106 may be inspected via the tools 324a, 324b, and the tools 324a, 324b may be calibrated based on the results of these inspections in accordance with the process 1000. Likewise production substrates inspected via the stand-alone inspection tool 106 may be stored in one of the storage locations 326, 328, and subsequently inspected with the tools 324a, 324b. The tools 324a, 324b then may be calibrated in accordance with the process 2000.

The foregoing description discloses only exemplary embodiments of the invention. Modifications of the above disclosed apparatus and method which fall within the scope of the invention will be readily apparent to those of ordinary skill in the art. For instance, the storage locations employed to store production substrates such as the storage locations 326, 328 may be environmentally controlled (e.g., vacuum sealed, purged with an inert gas, etc.), may comprise substrate carriers such as front opening unified pods, etc.

Accordingly, while the present invention has been disclosed in connection with exemplary embodiments thereof, it should be understood that other embodiments may fall within the spirit and scope of the invention, as defined by the following claims.

The invention claimed is:

1. A system comprising:
   a processing tool adapted to process substrates;
   an integrated inspection tool coupled to the processing tool; and
   a controller adapted to communicate with the integrated inspection tool, the controller having computer program code adapted to:
      receive a first result generated by inspecting a production substrate with a stand-alone inspection tool that operates independently of the processing tool;
      receive a second result generated by inspecting the production substrate with the integrated inspection tool; and calibrate the integrated inspection tool based on the first and second results.

2. The system of claim 1 further comprising a stand-alone inspection tool adapted to inspect the production substrate and to generate the first result.

3. The system of claim 1 wherein the controller comprises computer program code adapted to calibrate the integrated inspection tool by:
   determining a difference between the first and second results; and
   using the difference to offset future results of the integrated inspection tool.

4. The system of claim 1 further comprising a storage location adapted to store the production substrate near the processing tool.

5. The system of claim 4 wherein:
   the storage location is adapted to store a plurality of production substrates, each configured to allow the integrated inspection tool to be calibrated for a different process performed within the processing tool.

6. The system of claim 4 wherein the storage location is adapted to be environmentally controlled.

7. The system of claim 6 wherein the storage location is adapted to be purged by an inert gas.

8. The system of claim 1 wherein:
   the processing tool includes an interface adapted to:
      receive substrates to be processed within the processing tool; and
      deliver the substrates to the processing tool; and
   the integrated inspection tool is coupled to the processing tool via the interface.

9. The system of claim 8 wherein the interface comprises a factory interface.

10. The system of claim 8 wherein the interface includes a storage location adapted to store the production substrate.

11. The system of claim 10 wherein the storage location is adapted to store a plurality of production substrates.

12. The system of claim 10 wherein the storage location comprises a substrate carrier.

13. The system of claim 12 wherein the substrate carrier comprises a front opening unified pod.

14. The system of claim 1 wherein the integrated inspection tool is an integrated metrology tool.

15. The system of claim 1 wherein the integrated inspection tool is an integrated defect detection tool.

16. The system of claim 1 wherein the controller comprises computer program code adapted to determine when to calibrate the integrated inspection tool.

17. The system of claim 16 wherein the controller comprises computer program code adapted to determine when to calibrate the integrated inspection tool based on a number of substrates processed within the processing tool.

18. The system of claim 16 wherein the controller comprises computer program code adapted to determine when to calibrate the integrated inspection tool based on a time between calibrations.

19. The system of claim 1 wherein the controller comprises computer program code adapted to determine when to calibrate the stand-alone inspection tool with a standard substrate.

20. The system of claim 1 further comprising:
   a second processing tool adapted to process substrates; and
   a second integrated inspection tool coupled to the second processing tool; and
   wherein the controller is adapted to communicate with the integrated inspection tool coupled to the second processing tool and includes computer program code adapted to:
      receive a third result generated by inspecting a second production substrate with the stand-alone inspection tool;
      receive a fourth result generated by inspecting the second production substrate with the second integrated inspection tool; and
      calibrate the second integrated inspection tool based on the third and fourth results.

21. The system of claim 20 further comprising computer program code adapted to determine when to calibrate each processing tool.

22. A method for use with a processing tool having an integrated inspection tool coupled to the processing tool, the integrated inspection tool adapted to inspect substrates processed within the processing tool, the method comprising:
   receiving a first result generated by inspecting a production substrate with a stand-alone inspection tool that operates independently of the processing tool;
   receiving a second result generated by inspecting the production substrate with the integrated inspection tool; and
   calibrating the integrated inspection tool based on the first and second results.

23. The method of claim 22 wherein calibrating the integrated inspection tool based on the first and second results comprises:
   determining a difference between the first and second results; and
   using the difference to offset future results of the integrated inspection tool.

24. The method of claim 22 further comprising storing the production substrate at a storage location near the processing tool.

25. The method of claim 24 wherein storing the production substrate comprises storing the production substrate at a storage location adapted to store a plurality of production substrates.

26. The method of claim 24 wherein storing the production substrate comprises storing the production substrate at a storage location of an interface that couples the integrated inspection tool to the processing tool.

27. The method of claim 26 wherein the interface comprises a factory interface.

28. The method of claim 22 further comprising determining when to calibrate the integrated inspection tool.

29. The method of claim 22 further comprising:
   receiving a third result generated by inspecting a second production substrate with the stand-alone inspection tool;
   receiving a fourth result generated by inspecting the second production substrate with a second integrated inspection tool; and
   calibrating the second integrated inspection tool based on the third and fourth results.

30. The system of claim 29 further comprising determining when to calibrate each integrated inspection tool.

31. A computer program product useable with a processing tool having an integrated inspection tool coupled to the processing tool, the integrated inspection tool adapted to inspect substrates processed within the processing tool, the computer program product comprising:
   a medium readable by a computer, the computer readable medium having computer program code adapted to:
      receive a first result generated by inspecting a production substrate with a stand-alone inspection tool that operates independently of the processing tool;

receive a second result generated by inspecting the production substrate with the integrated inspection tool; and calibrate the integrated inspection tool based on the first and second results.

32. A system comprising:

a processing tool adapted to process substrates;

an integrated inspection tool coupled to the processing tool; and a controller adapted to communicate with the integrated inspection tool, the controller having computer program code adapted to:

receive a first result generated by inspecting a production substrate with a stand-alone inspection tool that operates independently of the processing tool;

initiate a transfer of the production substrate from the stand-alone inspection tool to a storage location near the processing tool;

initiate a transfer of the production substrate from the storage location to the integrated inspection tool;

receive a second result generated by inspecting the production substrate with the integrated inspection tool; and calibrate the integrated inspection tool based on the first and second results.

33. A method for use with a processing tool having an integrated inspection tool coupled to the processing tool, the integrated inspection tool adapted to inspect substrates processed within the processing tool, the method comprising:

receiving a first result generated by inspecting a production substrate with a stand-alone inspection tool that operates independently of the processing tool;

storing the production substrate near the processing tool;

receiving a second result generated by inspecting the production substrate with the integrated inspection tool; and calibrating the integrated inspection tool based on the first and second results.

34. A computer program product useable with a processing tool having an integrated inspection tool coupled to the processing tool, the integrated inspection tool adapted to inspect substrates processed within the processing tool, the computer program product comprising:

a medium readable by a computer, the computer readable medium having computer program code adapted to:

receive a first result generated by inspecting a production substrate with a stand-alone inspection tool that operates independently of the processing tool;

initiate a transfer of the production substrate from the stand-alone inspection tool to a storage location near the processing tool;

initiate a transfer of the production substrate from the storage location to the integrated inspection tool;

receive a second result generated by inspecting the production substrate with the integrated inspection tool; and calibrate the integrated inspection tool based on the first and second inspection results.

35. A method comprising:

selecting one of a plurality of integrated inspection tools to calibrate, the selected integrated inspection tool being coupled to a processing tool;

inspecting a production substrate with a stand-alone inspection tool that operates independently of the processing tool to generate a first result;

inspecting the production substrate with the selected integrated inspection tool to generate a second result;

determining a difference between the first and second results; and using the difference to offset future results of the selected integrated inspection tool.

* * * * *